(12) United States Patent
Leung

(10) Patent No.: US 6,222,785 B1
(45) Date of Patent: Apr. 24, 2001

(54) METHOD AND APPARATUS FOR REFRESHING A SEMICONDUCTOR MEMORY USING IDLE MEMORY CYCLES

(75) Inventor: Wingyu Leung, Cupertino, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/234,778

(22) Filed: Jan. 20, 1999

(51) Int. Cl.[7] .................................................. G11C 7/00
(52) U.S. Cl. ................................................................ 365/222
(58) Field of Search ............................................. 365/222

(56) References Cited

U.S. PATENT DOCUMENTS

| | | | |
|---|---|---|---|
| 5,033,027 | * 7/1991 | Amin ..................................... | 365/222 |
| 5,559,750 | 9/1996 | Dosaka et al. ................... | 365/230.06 |
| 5,802,555 | 9/1998 | Shigeeda . | |
| 5,822,265 | 10/1998 | Zdenek . | |
| 5,873,114 | * 2/1999 | Rahman et al. ...................... | 365/222 |
| 5,999,474 | * 12/1999 | Leung et al. .......................... | 365/222 |

FOREIGN PATENT DOCUMENTS

| | | |
|---|---|---|
| 0 794 497 A2 | 9/1997 | (EP) . |
| 2 265 035 | 9/1993 | (GB) . |

OTHER PUBLICATIONS

Intel Corporation, "Pentium Processor, 3.3V Pipelined BSRAM Specification", Version 2.0, May 25, 1995.
IBM Corporation, "16Mbit Synchronous DRAM", May 5 1966, pp. 1–100.
NEC Electronics Inc., "Dynamic CMOS Ram," pp. 6–101 to 6–113.
SLDRAM Consortium, "400 Mb/s/pin SLDRAM", pp. 1–59.
Rambus Inc. 1997, "Direct Rambus Technology Disclosure", pp. 1–48.
Ramtron International Corporation, 1994, "DM2202/2212 EDRAM 1 Mb×4 Enhanced Dynamic RAM", pp. 2–17 to 2–33.

* cited by examiner

Primary Examiner—Trong Phan
(74) Attorney, Agent, or Firm—Bever, Hoffman & Harms, LLP; E. Eric Hoffman

(57) ABSTRACT

A memory system is provided that controls a memory that must be refreshed, such as DRAM, in a manner that does not require extensive external control. In one embodiment, the memory system includes a memory controller and a memory block that are coupled by a system bus. The memory block includes an array of memory cells that must be periodically refreshed to maintain valid data. The memory block also includes a refresh control circuit that refreshes the memory cells during idle cycles of the memory array. The memory controller monitors the number of idle cycles on the system bus during a predetermined refresh period. If the number of monitored idle cycles is less than a predetermined required number of idle cycles, the memory controller forces the required number of idle cycles on the system bus. As a result, the memory controller ensures that there will always be enough idle cycles in which the memory array can be refreshed.

31 Claims, 8 Drawing Sheets

METHOD AND APPARATUS FOR REFRESHING A SEMICONDUCTOR MEMORY USING IDLE MEMORY CYCLES

FIELD OF THE INVENTION

The present invention relates to a semiconductor memory that must be periodically refreshed. More specifically, the present invention relates to a method and apparatus for performing refresh operations in a semiconductor memory during idle cycles of the memory.

DISCUSSION OF RELATED ART

Some conventional semiconductor memories, such as dynamic random access memory (DRAM), must be periodically refreshed in order to retain valid data. During refresh operations, external access typically is not allowed. In addition, a mechanism is required to inform the memory controller that the DRAM is performing a refresh operation. Any pending memory transaction has to be delayed until the refresh operation is completed. Refresh operations therefore lengthen the overall access time for memory accesses. It is therefore important to design a memory system in which the impact of refresh operations on external memory access is minimized.

Many different methods have been proposed to refresh these semiconductor memories. In one of these methods, which is commonly referred to as "CAS before RAS," an external device signals a refresh operation by asserting a column access signal CAS# prior to asserting a row access signal RAS#. During normal accesses, the column address strobe signal RAS# is asserted before the column address strobe signal CAS#. In response to detecting the "CAS before RAS" condition, the memory performs a refresh operation. The refresh operation typically is performed by reading the row of the memory to be refreshed. A "CAS before RAS" refresh scheme is described in 1991 Memory Products Data Book, uPD424248 262,144×4-Bit Dynamic CMOS RAM, NEC Electronics, pp 6–101 to 6–113. This reference also illustrates a hidden refresh that is a variation of the "CAS before RAS" refresh method. These methods for refresh require handshake communication between the semiconductor memory and the external device, making the external device control the memory refresh.

Another conventional semiconductor memory that must be periodically refreshed is synchronous DRAM (SDRAM). One conventional SDRAM initiates refresh operations in response to control signals (i.e., RAS#, CAS#, CS#, WE# and CKE) received from an external device. These control signals are decoded to provide command codes that are used to control the refresh operations of the SDRAM. For example, when the control signals RAS#, CAS#, CS#, WE# and CKE have values of 0,0,0,1, and 1, a control code for initiating an auto refresh operation is generated. Similarly, when those same control signals have values of 0,0,0,1, and 0, a control code for initiating a self refresh operation is generated. This SDRAM is described in more detail IBM0316409C, 16 Mbit Synchronous DRAM data sheet, 1996, IBM Corporation.

Other synchronous DRAM have used explicit command codes for handling memory refresh. These include SLDRAM [4M×18 SLDRAM CONS400.P65-Rev. Sep. 9, 1997, 400 Mb/s/pin SLDRAM SLD4M18DR400 4M×18 SLDRAM Data Sheet, SLDRAM Consortium] and Rambus DRAM (RDRAM). [Direct Rambus Technology Disclosure, Oct. 15, 1997, Rambus Inc.] All of the above-described command codes are generated by the external device, and must be communicated to the memory device, thereby complicating the interface to the semiconductor memory. The interface then becomes incompatible with the interface of a simpler device, such as an SRAM.

Other conventional DRAM refresh schemes incorporate a dedicated refresh control signal. These schemes are exemplified by enhanced DRAM (EDRAM) [DM2202/2212 EDRAM, 1 Mb×4 Enhanced Dynamic RAM, 1994, Ramtron International Corporation] and cache DRAM (CDRAM) [Dosaka et. al, U.S. Pat. No. 5,559,750]. In both the EDRAM and the CDRAM, a dedicated external refresh signal is used to initiate refresh operations. As noted with the external signals of the aforementioned devices, this additional external signal is incompatible with an SRAM and other simple interface devices.

Schemes for performing refresh operations during unused idle memory cycles of a DRAM are described in U.S. patent application Ser. No. 09/076,608 entitled "Method And Structure For Controlling Operation Of A DRAM Array", U.S. patent application Ser. No. 09/037,396 entitled "Method And Apparatus For 1-T SRAM Compatible Memory", U.S. patent application Ser. No. 09/165,228 entitled "Method And Apparatus For Complete Hiding Of The Refresh Of A Semiconductor Memory", and U.S. patent application Ser. No. 09/181,840 entitled "Method And Apparatus For Increasing The Time Available For Refresh For 1-T SRAM Compatible Devices", all by the present inventor.

SUMMARY

Accordingly, the present invention provides a memory system having a memory controller and one or more memory blocks that are commonly coupled to a system bus. Each memory block includes an array of memory cells that must be periodically refreshed to retain valid data. Each memory block also includes a refresh control circuit that refreshes the memory cells during idle cycles of the memory array.

The memory controller includes a refresh manager that monitors the number of idle cycles on the system bus during a refresh period, and forces one or more idle cycles on the system bus if the monitored number of idle cycles is less than a predetermined number of idle cycles during the refresh period. For example, in one embodiment, the refresh period for eight rows of memory cells is 20.48 microseconds. If the refresh manager detects fewer than eight idle cycles on the system bus during the 20.48 microsecond refresh period, then the refresh manager forces the appropriate number of idle cycles onto the system bus at the end of the refresh period. For example, if the refresh manager only detects six idle cycles on the system bus during the refresh period, then the refresh manager will force two additional idle cycles on the system bus at the end of the refresh period. As a result, eight idle cycles are provided on the system bus. Each of the memory blocks performs a pending refresh operation during an idle cycle on the system bus. As a result, the eight rows of memory cells are always refreshed within eight cycles of the end of the refresh period (or shorter). There is a relatively high probability that the refresh manager will not have to force any idle cycles at the end of the refresh period. Moreover, even if idle cycles must be forced, the maximum time required for these idle cycles represents a small fraction of the refresh period (e.g., 0.4 percent).

While idle cycles are being forced, the refresh manager asserts a control signal that informs accessing clients of the memory system that memory accesses must be deferred. After the idle cycles have been forced, the refresh manager de-asserts the control signal to inform the accessing clients that memory accesses can proceed.

In a particular embodiment, the refresh manager includes an idle cycle counter for counting the number of idle cycles on the system bus. When the number of idle cycles on the system bus is equal to the predetermined number of idle cycles, the idle cycle counter generates a FULL signal. A refresh counter is coupled to receive the FULL signal. If the refresh counter determines that the refresh period expires prior to receiving the FULL signal from the idle cycle counter, then the refresh counter asserts a control signal that forces idle cycles on the system bus. If the refresh counter receives the FULL signal prior to the expiration of the refresh period, the refresh counter is reset, thereby beginning a new refresh period.

Within each memory block, an access arbiter receives external access requests (which are initiated by the memory controller) and refresh requests (which are generated within the memory block). The access arbiter always grants priority to any pending external access request. The access arbiter will allow refresh requests to be granted only if there are no pending external access requests. As a result, the refresh requests do not impede the external access requests. The refresh operations are performed during naturally occurring idle cycles or during the forced idle cycles.

In another embodiment, the memory blocks are logically divided into two or more sets. In this embodiment, the refresh manager monitors the number of idle cycles occurring in each set of memory blocks during the refresh period. The refresh manager forces idle cycles on the system bus only if the number of idle cycles occurring in at least one set of memory blocks during the refresh period is less than the predetermined number of idle cycles.

In yet another embodiment of the present invention, the refresh manager is modified to force a predetermined number of idle cycles on the system bus after the refresh period has expired, regardless of the number of idle cycles occurring during the refresh period. For example, the refresh manager can force eight idle cycles at the end of each refresh period.

DETAILED DESCRIPTION

In light of the related art, it would be desirable to construct a memory device in which the impact of refresh operations on external memory access is minimized. Accordingly, the present invention provides a memory system in which the majority of refresh operations are carried out within the memory device during idle memory cycles. Idle memory cycles are clock cycles in which there is no on-going or pending memory access to the memory device.

A situation may occur where memory access is sustained for a period of time longer than the required time for memory refresh. In this case, the present invention suspends memory access, forcing idle cycles to carry out refresh operations. However, the mechanism of performing a refresh operation in the present invention does not require external signaling, such as using an explicit command code or signal. This allows the implementation of a simple memory interface, such as one compatible with that of an SRAM.

Figure 1:
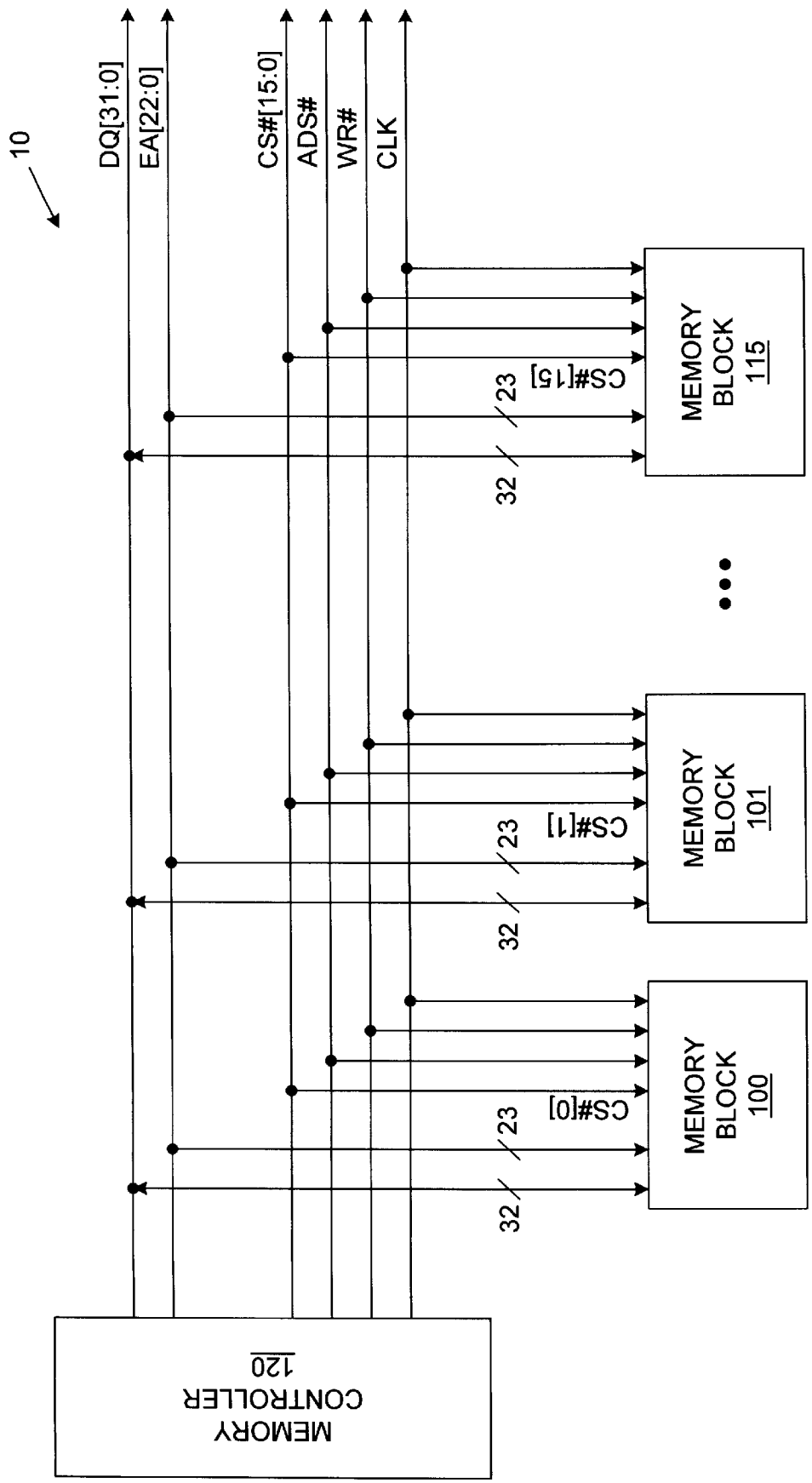
FIG. 1 is a block diagram of a memory system in accordance with one embodiment of the present invention.

FIG. 1 is a block diagram of memory system 10 in accordance with one embodiment of the present invention. Memory system 10 includes memory blocks 100–115 and memory controller 120. Memory controller 120 can be part of a processor or system logic. Each of memory blocks 100–115 includes an array of DRAM cells that requires periodic refresh to retain valid data. Memory blocks 102–114 are not illustrated for purposes of clarity. Although the present embodiment includes memory blocks requiring refresh (e.g. SRAM devices), other memory devices that do not require refresh can also be connected to the same bus as memory blocks 100–115. Each of memory blocks 100–115 is coupled to receive the following signals from memory controller 120: bi-directional data signals DQ[31:0], external address signals EA[22:0], address strobe signal ADS#, and write/read enable signal WR#. Each of memory blocks 100–115 receives a dedicated chip select CS# signal. For example, memory blocks 100 and 101 receive chip select signals CS#[0] and CS#[1], respectively. A clock signal CLK is provided to synchronize memory transactions between memory blocks 100–115 and memory controller 120.

In the described embodiment, memory blocks 100–115 are identical. However, in other embodiments these memory blocks may include different circuitry. Moreover, although sixteen memory blocks are described, it is understood that there can be other numbers of memory blocks in other embodiments. The number of CS# signals will change accordingly. Additionally, data and address signals having other widths can be used in other embodiments.

Each of memory blocks 100–115 includes one or more memory arrays having multiple rows and columns of DRAM memory cells. Each of memory blocks 100–115 also includes all the conventional circuits associated with a DRAM, such as word line drivers, sense amplifiers, and column multiplexers. In other embodiments, memory blocks 100–115 can additionally include memory arrays that do not require refresh operations.

Figure 2:
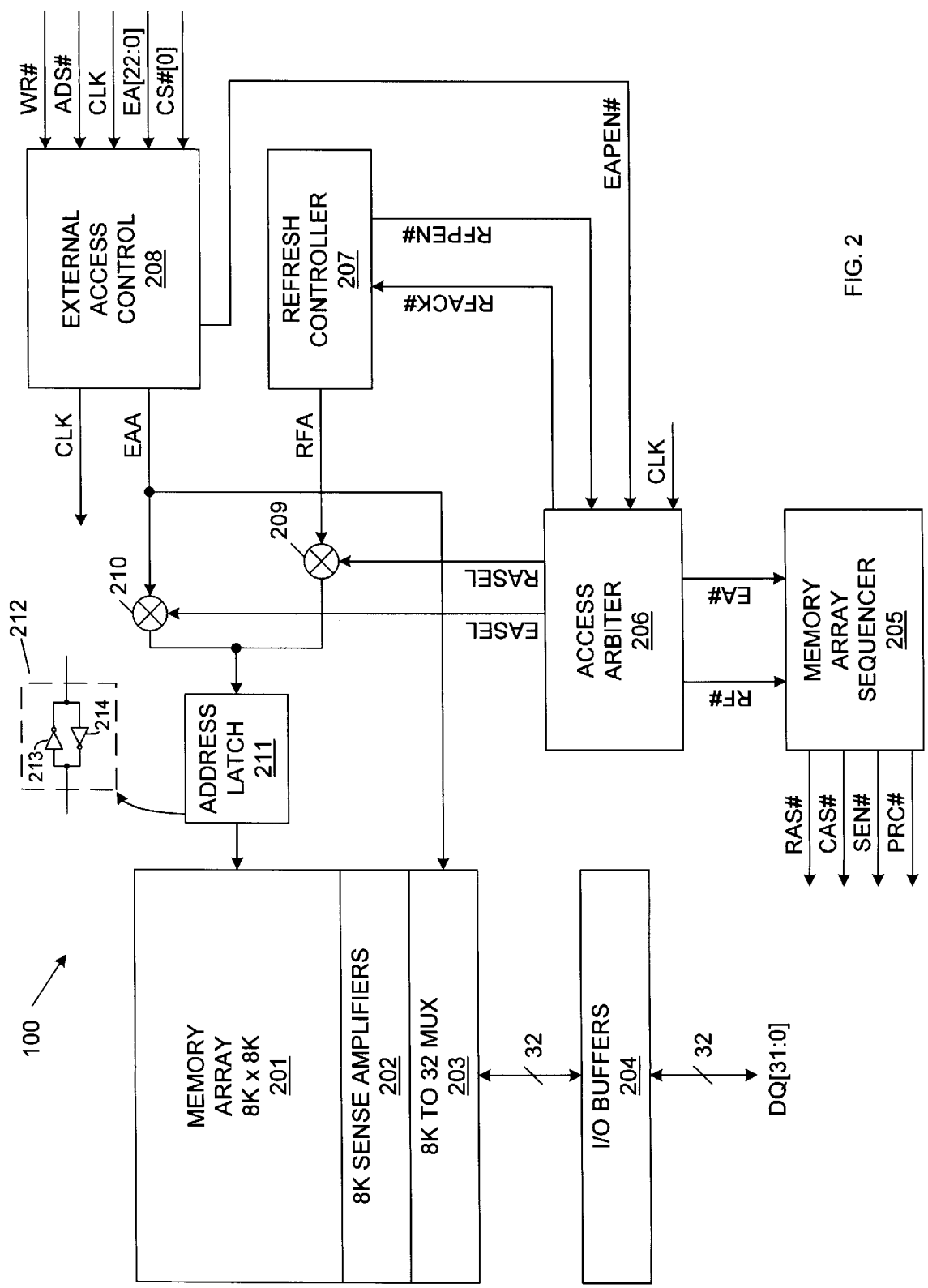
FIG. 2 is a schematic diagram of a memory block for controlling refresh and external access to a memory array in accordance with one embodiment of the present invention.

FIG. 2 is a schematic diagram illustrating memory block 100. Memory block 100 includes memory array 201, sense amplifiers 202, multiplexer 203, I/O buffers 204, memory array sequencer 205, access arbiter 206, refresh controller 207 external access control 208, transmission gates 209 and 210, and address latch 211.

In the described embodiment, each of memory blocks 100–115 has its own memory array sequencer 205, access arbiter 206, refresh controller 207, external access control

208, transmission gates 209 and 210 and address latch 211. Address latch 211 includes a plurality of storage elements formed by cross-coupled inverters. For example, storage element 212, which includes cross-coupled inverters 213 and 214, stores one bit of the address value to be provided to memory array 201. In this embodiment, memory system 10 is organized as a multiple bank system, wherein parallel operations can be performed in different banks simultaneously. This multiple bank memory structure is similar to that described in U.S. patent application Ser. No. 09/037,396 entitled "Method And Apparatus For 1-T SRAM Compatible Memory" by the present inventor.

In another embodiment, a plurality of memory arrays (such as 201) are controlled by a single memory array sequencer 205, access arbiter 206, refresh controller 207, external access control 208, transmission gates 209 and 210, and address latch 211.

In the present embodiment, memory array 201 has 8K (8192) rows and 8K columns, yielding 64 megabits of memory. To access each memory location, external address signals EA[22:0] are provided to each memory block 100–115. It is understood that in other embodiments, memory array 201 can have a different size, thereby requiring other numbers of external address signals. Associated with each column within memory array 201 is a sense amplifier within sense amplifier circuit 202 which performs the data sensing, restore, and write operations. During each memory access, one row of memory array 201 is activated and the 8K memory cells of that row are connected to sense amplifiers 202 in each column. Sense amplifiers 202 are connected to I/O buffers 204 through multiplexer 203.

In the described embodiment, memory controller 120 drives the entire external address EA[22:0] onto the address bus at once. However, it is understood that the address may be multiplexed onto the address bus in separate clock cycle or clock phase portions, thereby reducing the required number of address signals. In the preferred embodiment, the address strobe ADS# and system clock CLK signaling is similar to the industry standard for synchronous static random access memory, set forth in Pentium Processor 3.3v Pipeline BSRAM specification version 2.0, May 25, 1995, Intel.

An external access is performed as follows. External access control 208 is coupled to receive the signals write/read WR#, address strobe ADS#, system clock CLK and external address EA[22:0] from memory controller 120. In response to these signals, external access control 208 generates an external access address EAA (which is equal to the external address EA[22:0]) and asserts an access pending enable signal EAPEN#.

To initiate a memory access to memory block 100, memory controller 120 asserts the address strobe signal ADS# low, asserts the chip select signal CS#[0] low, and provides the external address EA[22:0] on the external address bus. At the rising edge of the CLK signal, external access control 208 evaluates the state of the address strobe ADS# and chip select CS#[0] signals. If both signals are detected low, external access control 208 initiates an external access by asserting the external access pending signal EAPEN# low.

Access arbiter 206 is coupled to receive the external access pending signal EAPEN#. Upon detecting a low external access pending signal EAPEN#, access arbiter 206 asserts a high external address select signal EASEL. The high external address select signal EASEL causes transmission gate 210 to route the external access address EAA from external access control 208 to address latch 211. Address latch 211 provides the external access address EAA to memory array 201. Upon detecting the low state of the external access pending signal EAPEN#, access arbiter 206 asserts an external access signal EA#, which is provided to memory array sequencer 205. In response to the low asserted external access signal EA#, memory array sequencer 205 provides the DRAM control signals row address strobe RAS#, column address strobe CASE, sense amplifier enable SEN# and pre-charge PRC# to memory array 201 for controlling array operations. A method of generating the signals RAS#, CAS#, SEN# and PRC# in a self-timed manner is described in U.S. patent application Ser. No. 09/076,608 entitled "Method And Structure For Controlling Operation Of A DRAM Array," by the present inventor, which is hereby incorporated by reference. Generating the RAS#, CAS#, SEN# and PRC# signals in this manner enables a memory cycle to be completed in one clock cycle.

Each clock cycle without an external memory access is called an idle clock cycle. A memory refresh operation can be performed during an idle clock cycle by reading a row of memory array 201. Refresh controller 207 generates a refresh pending enable signal RFPEN#, which is provided to access arbiter 206, and a refresh address RFA, which is provided to transmission gate 209. Refresh controller 207 is coupled to receive a refresh acknowledge signal RFACK# from access arbiter 206. The refresh address RFA is the address of the row of memory array 201 to be refreshed. Memory array 201 is refreshed one row at a time, requiring 8K refreshes in the present embodiment. Refresh controller 207 generates refresh requests to ensure memory array 201 is properly refreshed. The timing of the refresh requests thus generated is determined from the system clock speed and the measured memory retention time of memory array 201. For a system clock speed of 100 megahertz and a total memory retention time of 21.05 milliseconds, refresh controller 207 must generate a refresh request at least once every 2.56 microseconds. In general, the refresh period is chosen to ensure that the data retention time of memory array 201 is longer than the greatest possible time required to refresh every row of memory array 201.

Refresh controller 207 asserts the refresh pending enable signal RFPEN# low when a request to refresh a row of memory array 201 is pending. If the external access pending signal EAPEN# is high, indicating that no external accesses are pending, access arbiter 206 begins a refresh operation by driving the refresh acknowledge signal RFACK# low and the refresh address select signal RASEL high for one clock cycle. Transmission gate 209 receives the high refresh address select signal RASEL, and in response routes the refresh address RFA from refresh controller 207 to address latch 211. Address latch 211 provides the refresh address RFA to memory array 201.

The high state of the external access pending signal EAPEN# and the low state of the refresh pending enable signal RFPEN# also cause access arbiter 206 to assert low the refresh signal RF# provided to memory array sequencer 205. In response to the low asserted refresh signal RF#, memory array sequencer 205 provides the DRAM control signals row address strobe RAS#, sense amplifier enable SEN# and pre-charge PRC# to memory array 201 for controlling memory array 201 operations. As a result, a refresh access is performed to the row address identified by the refresh address RFA. The column address strobe CAS# is not activated during a refresh cycle. Access arbiter 206 asserts a logic low refresh acknowledge signal RFACK# to indicate to refresh controller 207 that a refresh operation has been performed. The timing of these operations is shown in FIG. 3.

Figure 3:
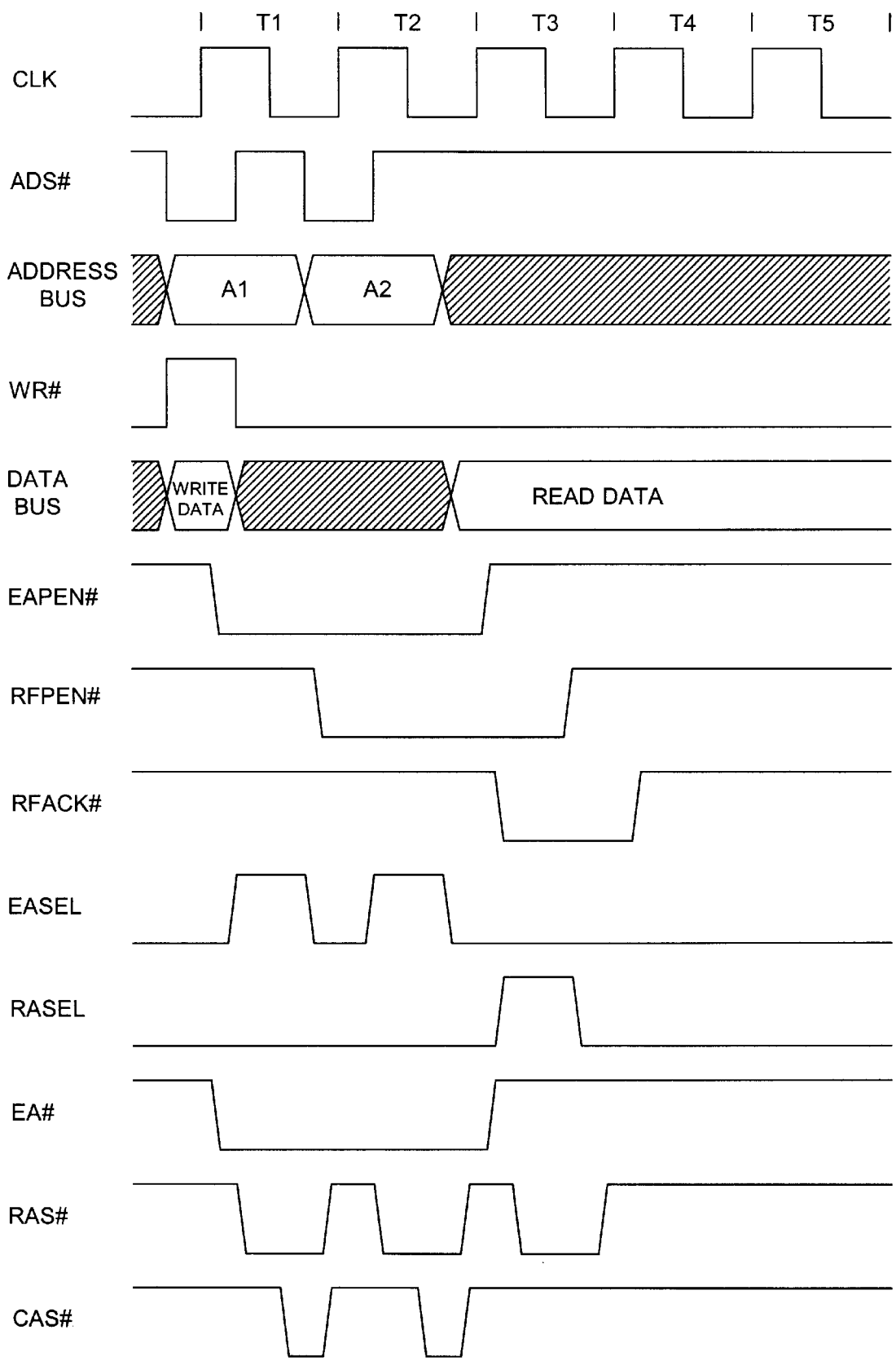
FIG. 3 is a waveform diagram of the timing of various signals during write, read and refresh operations in accordance with one embodiment of the present invention.

FIG. 3 is a waveform diagram of the timing of various signals in accordance with one embodiment of the present invention. The waveform diagram illustrates write, read and refresh operations in memory block 100 during three successive clock cycles T1–T3. Memory controller 120 completes a memory cycle in one clock period. Since a memory cycle takes only one clock period, memory block 100 will process one external memory access or memory row refresh in each clock cycle. Each clock cycle begins at the rising edge of the clock signal CLK.

To initiate an external write access, memory controller 120 asserts both the address strobe ADS# and the chip select CS#[0] signals low to access memory block 100. For this example, the chip select signal CS#[0] will be identical to the address strobe signal ADS#. Memory control 120 also provides a write address A1 on the external address bus and a write data value on the external data bus. Memory controller 120 further provides a logic high write/read signal WR#, thereby indicating that the external access is a write access. At the rising edge of the system clock signal CLK for cycle T1, external access control 208 evaluates the state of the address strobe signal ADS# and the chip select signal CS#[0]. Upon detecting a low address strobe signal ADS#, a low chip select signal CS#[0], and a high write/read signal WR#, external access control 208 initiates an external write access. External access control 208 asserts the external access pending signal EAPEN# low. The low external access pending signal EAPEN# provided to access arbiter 206 causes access arbiter 206 to assert the external access signal EA# low. In response to the low asserted external access signal EA#, memory array sequencer 205 provides the DRAM control signals row address strobe RAS# and column address strobe CAS# to memory array 201 for controlling array write operations. Access arbiter 206 also provides a logic high external address select signal EASEL to transmission gate 210, thereby causing transmission gate 210 to route the write address A1 to address latch 211. Address latch 211 provides the write address A1 to memory array 201.

Prior to the rising edge of the system clock signal CLK, at the beginning of cycle T2, memory controller 120 again asserts the address strobe signal ADS# and the chip select signal CS#[0] low to access memory block 100. Memory controller 120 also provides a read address A2 on the external address bus. Memory controller 120 further provides a logic low write/read signal WR#, thereby indicating that the external access is a read access. At the rising edge of the system clock signal CLK for cycle T2, external access control 208 again evaluates the state of the address strobe signal ADS# and the chip select signal CS#[0]. Upon detecting a low address strobe signal ADS#, a low chip select signal CS#[0], and a low write/read signal WR#, external access control 208 initiates an external read access. External access control 208 continues to assert the external access pending signal EAPEN# low. The low external access pending signal EAPEN# provided to access arbiter 206 keeps the external access signal EA# low. In response to the low asserted external access signal EA#, memory array sequencer 205 provides the DRAM control signals row address strobe RAS# and column address strobe CAS# to memory array 201 for controlling array read operations. Access arbiter 206 also provides a logic high external address select signal EASEL for one half of a clock cycle to transmission gate 210, thereby causing transmission gate 210 to route the read address A2 to address latch 211. Address latch 211 provides the read address A2 to memory array 201.

During system clock CLK cycle T1, refresh controller 207 asserts the refresh pending signal RFPEN# low to indicate a refresh is required. As described above, an external access is also pending during cycle T2. Therefore two different requests are pending during cycle T2, resulting in a signal collision. Access arbiter 206 acts to delay the refresh request in the case of such a collision until an idle memory cycle. An idle memory cycle is a memory cycle with no external memory access.

At the rising edge of the system clock signal CLK in cycle T3, external access control 208 again evaluates the state of the address strobe ADS# and the chip select CS#[0] signals. The high state of either the address strobe signal ADS# or the chip select signal CS#[0] indicates an idle memory cycle exists during cycle T3. Access arbiter 206 allows the refresh to occur in this idle memory cycle by deasserting the external address signal EA# high, asserting the refresh signal RF# low, and providing a high refresh address select signal RASEL. The refresh adderss select signal RASEL is driven high for half of a clock cycle. Under these conditions, transmission gate 209 routes the refresh address RFA through address latch 211 to memory array 201 and memory array sequencer 205 provides the row address strobe signal RAS# to refresh memory array 201. As a result, a refresh access is performed to the refresh address RFA generated by refresh controller 207.

Figure 4:
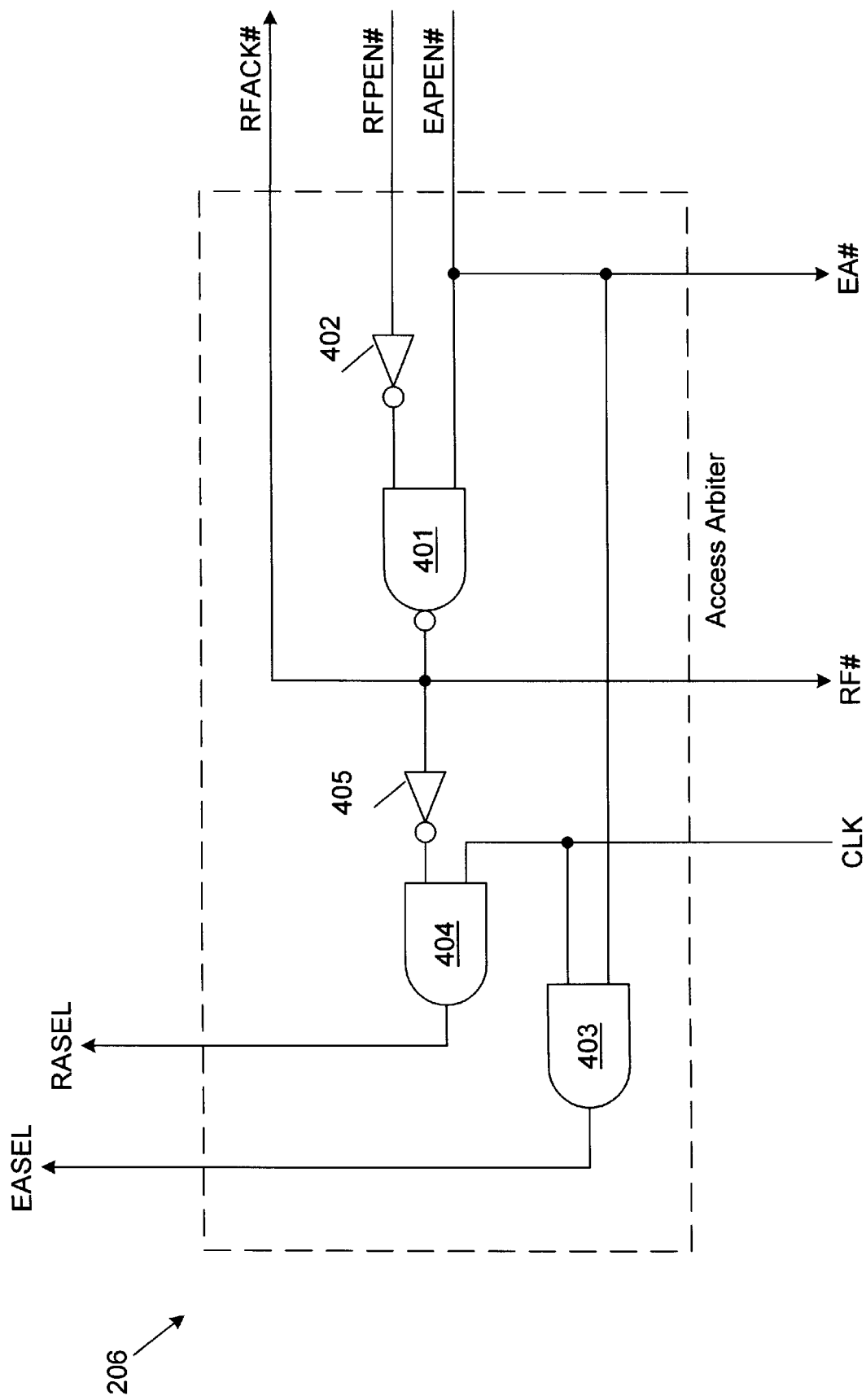
FIG. 4 is a schematic diagram of an access arbiter in accordance with one embodiment of the present invention.

FIG. 4 illustrates access arbiter 206 in accordance with one embodiment of the invention. In the present embodiment, access arbiter 206 includes two input NAND gate 401, two input AND gates 403 and 404, and inverters 402 and 405. The refresh pending signal RFPEN# is provided to the first input terminal of NAND gate 401 through inverter 402. The external access pending signal EAPEN# is provided to the second input terminal of NAND gate 401, the first input terminal of AND gate 403, and also to memory array sequencer 205 as the external address signal EA#. The system clock CLK is provided to the second input terminal of AND gate 403. The output signal of AND gate 403 is provided to transmission gate 210 as the external address select signal EASEL. The output signal of NAND gate 401 provides the refresh RF# and refresh acknowledge RFACK# signals to memory array sequencer 205 and refresh controller 207, respectively. Additionally, the output signal of NAND gate 401 is provided to the first input terminal of AND gate 404 through inverter 405. The system clock CLK is provided to the second input terminal of AND gate 404. The output signal of AND gate 404 is provided to transmission gate 209 as the refresh address select signal RASEL.

Access arbiter 206 functions to prevent refresh accesses except in the absence of a pending external access. In the case of a conflict of access between a pending external access and a pending refresh access, the external access always has priority. By giving the external accesses priority, the external accesses are not delayed by refresh accesses. If external access pending signal EAPEN# is low, indicating an external memory access in this cycle, the output signal of NAND gate 401 will be high, regardless of the state of the refresh pending signal RFPEN#. External address signal EA# is asserted low and refresh signal RF# is deasserted high, indicating an external memory access. Refresh acknowledge signal RFACK# is deasserted high, indicating that this memory cycle is not used for refresh. External address select signal EASEL is asserted high, moving the external access address EAA through address latch 211 on to the memory array 201 address bus.

When there is no pending external access, EAPEN# is deasserted high, allowing the refresh pending signal RFPEN# to drive the output signal of NAND gate 401. If there is no refresh pending, refresh pending signal RFPEN# will be deasserted high, providing a low signal from the output terminal of inverter 402 to the input terminal of NAND gate 401. The output signal of NAND gate 401 is therefore high, keeping refresh acknowledge signal RFACK# high to indicate that this memory cycle is not used for refresh. If there is a pending refresh, refresh acknowledge signal RFPEN# will be low, providing a high output signal from inverter 402 to the input terminal of NAND gate 401. This high signal and the high state of external access pending signal EAPEN# force the output signal of NAND gate 401 low. The output signal of NAND gate 401 drives the signals refresh RF# and refresh acknowledge RFACK# low. Additionally, the output signal of NAND gate 401 passes through inverter 405 and drives the output of AND gate 404 high when the system clock CLK goes high. Therefore, memory array sequencer 205 is provided with a low refresh signal RF#. Transmission gate 209 is provided with a high refresh address select signal RASEL, providing the refresh address RFA to address latch 211. The refresh acknowledge signal RFACK# is asserted low and provided to refresh controller 207, indicating the use of this clock cycle for a refresh.

Figure 5:
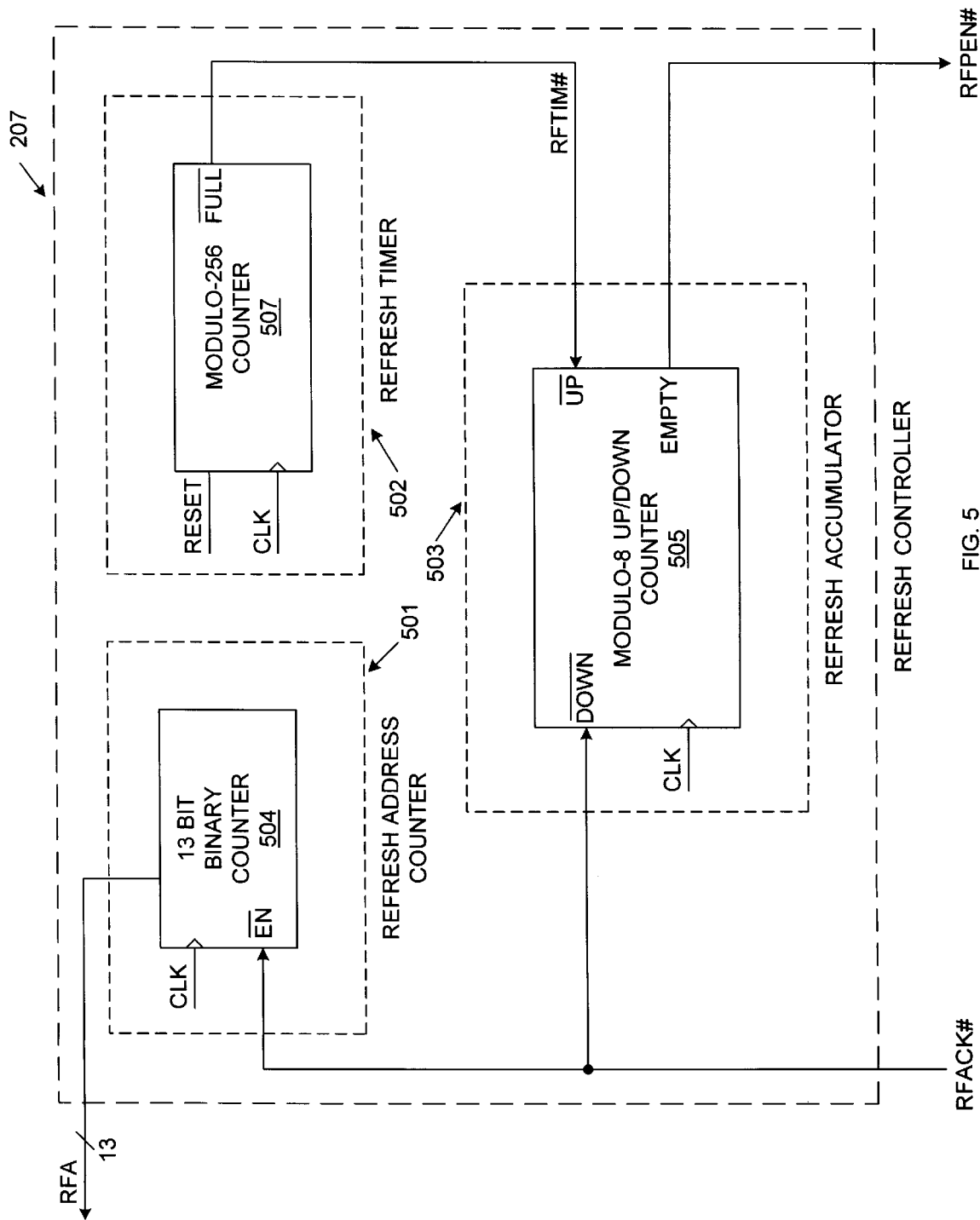
FIG. 5 is a schematic diagram of a refresh controller in accordance with one embodiment of the present invention.

FIG. 5 is a block diagram showing refresh controller 207 in accordance with one embodiment of the present invention. Refresh controller 207 includes refresh address counter 501, refresh timer 502 and refresh accumulator 503. Refresh address counter 501 includes thirteen bit binary counter 504 coupled to receive both the refresh acknowledge signal RFACK# and the system clock signal CLK. In response, binary counter 504 provides the current refresh address RFA on a thirteen bit address bus to transmission gate 209. The size of the address bus is chosen to access each row of memory array 201. The system clock CLK is provided to synchronize operations of binary counter 504. Refresh acknowledge signal RFACK# is high unless a memory refresh has occurred, asserting the refresh acknowledge signal RFACK# low for one clock cycle. Each low refresh acknowledge signal RFACK# increments binary counter 504, sequentially moving through the address of each memory row in memory array 201.

Refresh timer 502 includes modulo-256 counter 507. Counter 507 is coupled to provide the refresh time signal RFTIM# to refresh accumulator 503. System RESET and clock CLK signals are provided to initialize and synchronize operations of counter 507, respectively. Upon initial power up, counter 507 is initialized to zero by the system RESET command. The counter then increments once each clock cycle up to a full count of 255. The next increment of counter 507 asserts refresh time signal RFTIM# low for one clock cycle and rolls the count over to zero. Counter 507 counts 1 at the next CLK cycle, cycling again through the count. In the present embodiment, the refresh period thus tracked by counter 507 is 256 counts. This count of 256 divided by a 100 megaHertz clock asserts refresh time signal RFTIM# low each 2.56 microseconds. Although counter 507 is described as a modulo-256 counter in the present embodiment, it is understood that other methods of tracking a time period may be present in other embodiments.

Refresh accumulator 503 includes a modulo-8 up/down counter 505 that is coupled to receive the refresh acknowledge signal RFACK#, the refresh time signal RFTIM#, and the system clock signal CLK. A non-zero count for counter 505 asserts the refresh pending signal RFPEN# low. The system clock signal CLK is provided to synchronize counter operations.

In the present embodiment, counter 505 is a modulo-8 up/down counter. Each low refresh acknowledge signal RFACK# decrements the count by one, and each low refresh time signal RFTIM# increments the count by one. If the count kept by counter 505 is non-zero, the refresh pending RFPEN# output signal from counter 505 will be low, indicating to access arbiter 206 that at least one memory location within memory array 201 is ready for refresh. Refresh pending signal RFPEN# will remain low until enough refresh acknowledge signals RFACK# decrement the count of counter 505 to zero. Counter 505 is full at a count of 8. Therefore, refresh cycles could be lost if counter 505 reaches a full count and there are no subsequent refresh accesses performed before counter 507 asserts another low refresh time signal RFTIM#.

The present embodiment utilizes a modulo-8 refresh accumulator 503, which allows up to eight refresh time signals RFTIM# to be accumulated. Because a refresh time signal RFTIM# is generated every 2.56 microseconds, refresh accumulator 503 is capable of accumulating refresh requests for a 20.48 microsecond period. This 20.48 microsecond period is termed a proper refresh period. The proper refresh period is defined as the period of time that memory array 201 can be in constant external memory access without requiring a refresh operation. Although the present embodiment uses a modulo-8 accumulator, an accumulator capable of a different count can be used to adjust the duration of the proper refresh period. In the simplest alternate embodiment, an accumulator of one bit can be used, limiting the proper refresh period to be the individual period, which is 2.56 microseconds for a clock frequency of 100 megaHertz.

In summary, memory block 100 incorporates refresh timer 502 to generate periodic refresh requests, refresh address counter 501 to supply the address of the row to be refreshed, refresh accumulator 503 to store a number of refresh requests, and access arbiter 206 to defer the refresh operation when the memory is handling external access.

Memory block 100 performs refresh operations during clock cycles where there is no external access requested. To make sure that memory blocks 100–115 are refreshed properly, memory controller 120 needs to make sure that each of memory blocks 100–115 in the system has enough idle cycles in each proper refresh period to prevent the associated refresh accumulator 503 in each of these blocks from overflowing. As described above, refresh accumulator. 503 will store up to 8 refresh requests. Consequently, 8 idle cycles are required during a proper refresh period of 20.48 microseconds.

On average, one refresh access should be performed every 256 clock cycles. One refresh operation therefore occupies 1/256 or 0.4% of the available system cycles or bandwidth. In a typical system, this one idle cycle typically will be available without any intervention by memory controller 120, as is noted in U.S. patent application Ser. No. 09/037, 396 entitled "Method And Apparatus For 1-T SRAM Compatible memory," by the present inventor. This is especially true in a configuration such as is described in U.S. patent application Ser. No. 09/181,840 entitled "Method And Apparatus For Increasing The time Available For Refresh For 1-T SRAM Compatible Devices," by the present inventor. Additionally, the average system bandwidth needed for refresh operations decreases significantly with multiple memory devices as does the probability that one memory device is occupied with external access for a period longer than the proper refresh period.

Nevertheless, there is still a finite probability that a memory block may not be refreshed due to continuous memory access to the memory block for a duration greater than the proper refresh period. To ensure that memory blocks 100–115 are properly refreshed under all conditions, memory controller 120 must keep track of the number of idle cycles occurring within the proper refresh period, and suspend external memory access if the number of idle cycles is insufficient to allow adequate time for refresh operations.

Memory controller 120 controls external access to memory blocks 100–115 to ensure that each memory block has adequate time for refresh. It is possible that the external access requests will occupy a memory block for an entire proper refresh period. In such an event, fewer than the 8 required idle cycles for refresh are present during the proper refresh period. Under these conditions, memory controller 120 will delay external access until the required memory refresh operations are performed. Stated another way, memory controller 120 will force the required number of idle cycles to be present during a proper refresh period.

Figure 6:
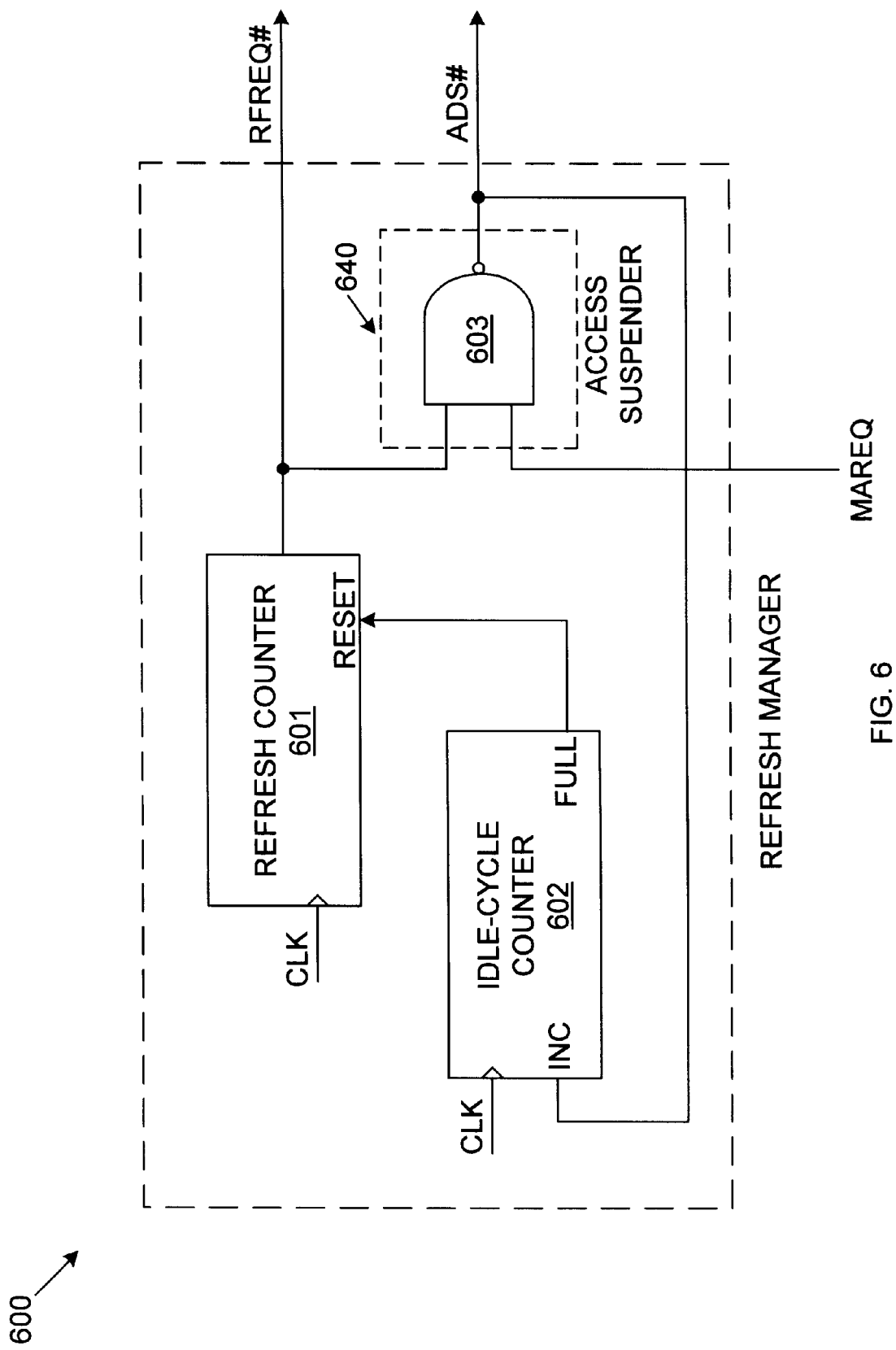
FIG. 6 is a schematic diagram of a refresh manager for controlling one group of memory blocks in accordance with one embodiment of the present invention.
Figure 7:
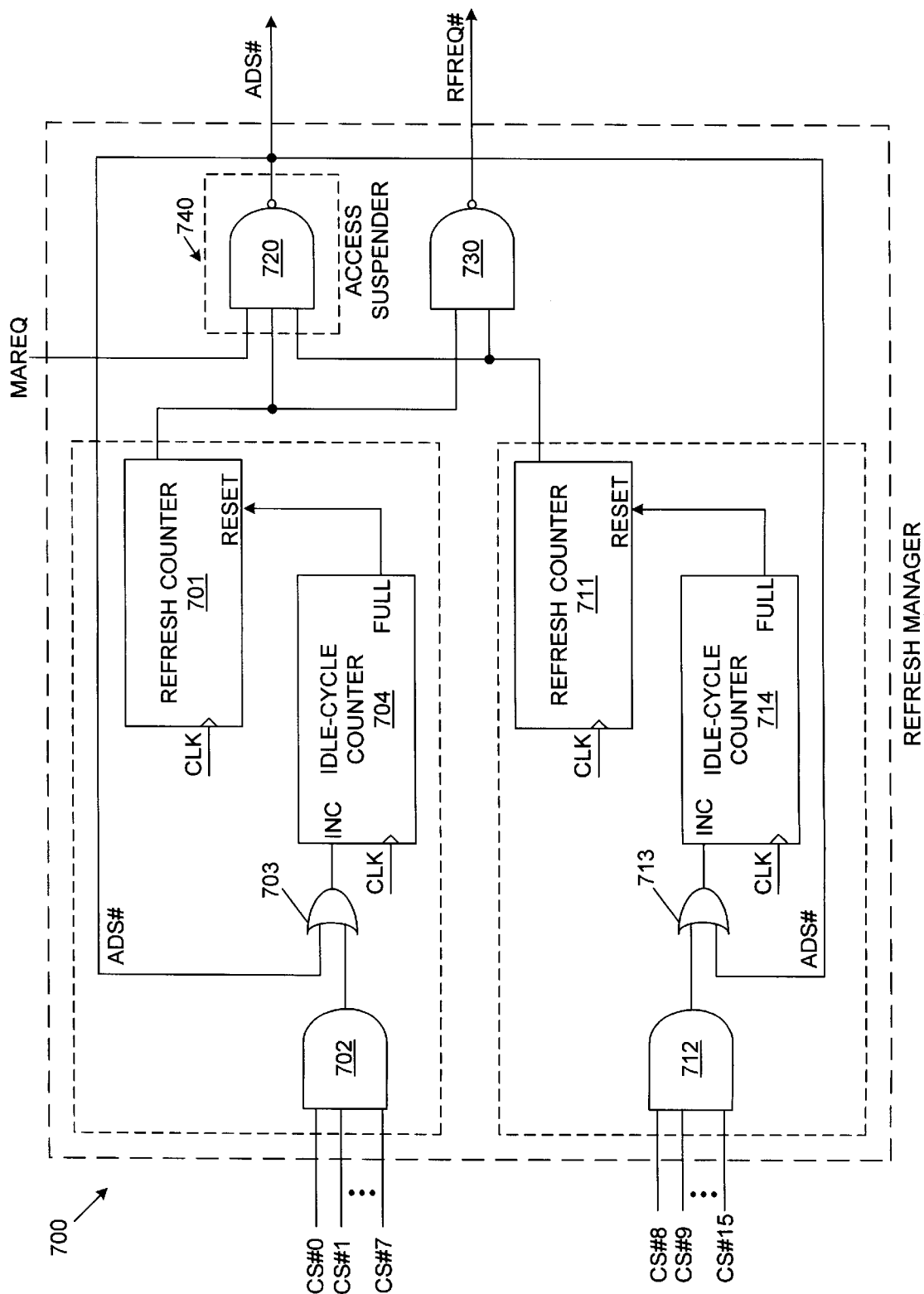
FIG. 7 is a schematic diagram of a refresh manager for controlling two groups of memory blocks in accordance with another embodiment of the present invention.
Figure 8:
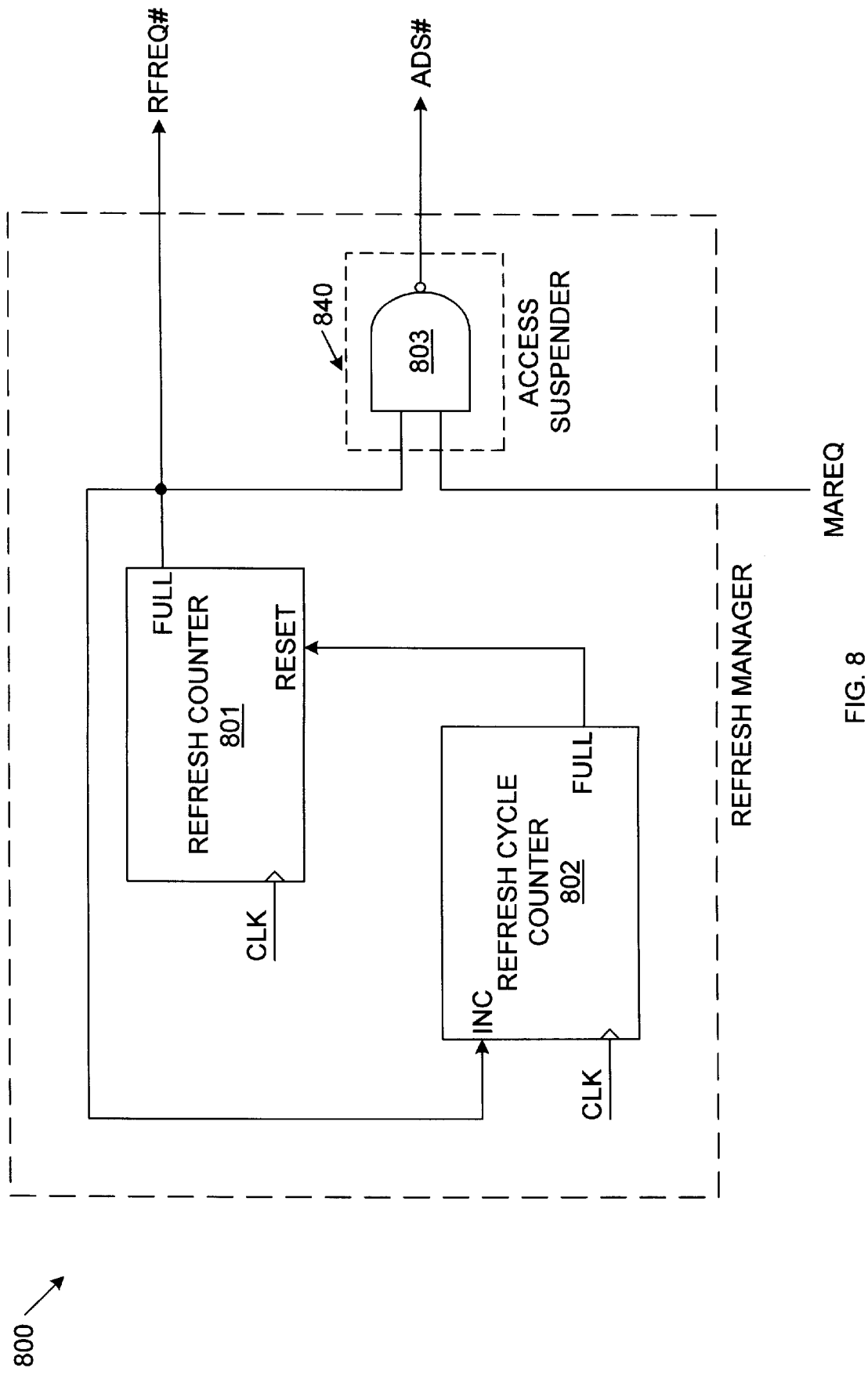
FIG. 8 is a schematic diagram of a refresh manager for forcing idle cycles into a memory system in accordance with another embodiment of the present invention.

FIGS. 6, 7 and 8 are schematic diagrams of refresh managers 600, 700, and 800, respectively, in accordance with various embodiments of the present invention. Refresh managers 600, 700 and 800 are each located in memory controller 120. Refresh managers 600, 700 and 800 generate a refresh required signal RFREQ# as well as the address strobe signal ADS#. The refresh required signal RFREQ# is returned to accessing devices (not shown) that access memory system 10. The accessing devices may or may not be located in the same chip as memory controller 120. The refresh required signal RFREQ# is asserted low to inform the accessing devices that additional accesses should be deferred. The address strobe signal ADS# indicates the presence of an idle cycle when in a logic high state, as described above.

The refresh manager portion of memory controller 120 contains a mechanism that ensures that the number of idle memory cycles within a proper refresh period equals or exceeds the number of refresh cycles required by each of memory blocks 100–115. It is noted that this mechanism does not require external communication between memory blocks 100–115 and memory controller 120. One advantage of this scheme is that memory blocks 100–115 can be used in place of static random access memory SRAM devices which use the same interface without any change of the control mechanisms in memory controller 120.

FIG. 6 is a schematic diagram of refresh controller 600, which includes refresh counter 601, idle-cycle counter 602 and access suspender 640. Access suspender 640 includes NAND gate 603, which provides address strobe signal ADS#. The system clock CLK is provided to synchronize operations. Refresh counter 601 counts from zero to an amount of time equal to the proper refresh period for memory array 201. In the present embodiment, refresh counter 601 counts to the maximum of refresh accumulator 503 and modulo-256 counter 507, which is 8 times 2.56 microseconds, equaling the 20.48 microsecond proper refresh period counted by refresh accumulator 503. The output refresh required RFREQ# signal of refresh counter 601 remains high unless the maximum refresh period has been counted. The refresh required signal RFREQ# is then asserted low, delaying memory access until refresh counter 601 is reset by idle-cycle counter 602.

Idle-cycle counter 602 is a three bit counter, and increments once each time an idle cycle is available for refresh. Refresh counter 601 is reset to count from zero each time idle-cycle counter 602 reaches the 8 idle cycles required in the proper refresh period for memory blocks 100–115 refresh. Therefore, if idle-cycle counter 602 reaches the full count of eight before refresh counter 601 counts the proper refresh period, a high signal is asserted at the RESET for refresh counter 601. This high RESET causes the refresh counter 601 to begin counting the proper refresh period from zero, keeping the address strobe signal ADS# high and allowing uninterrupted memory access.

Access suspender 640, which includes NAND gate 603, is coupled to receive the refresh required signal RFREQ# and the memory access required signal MAREQ. The memory access required signal MAREQ is asserted high when a memory request is received by memory controller 120 from an accessing device. Accessing devices of memory controller 120 can be a CPU, an I/O processor, a graphics processor or others. These possible accessing devices of memory controller 120 are not shown. If refresh counter 601 has not yet counted to the maximum refresh period, the refresh required signal RFREQ# will be high. Under these conditions, the output signal of access suspender 640 is dependent on the state of the memory access required signal MAREQ. An external request for memory access asserts the memory access required signal MAREQ high, resulting in a low output signal for the address strobe signal ADS# from access suspender 640. The low state of the address strobe signal ADS# indicates a memory access is pending. In the absence of a memory access, the memory access required signal MAREQ will be low, asserting the output signal address strobe ADS# of access suspender 640 high. The high address strobe signal ADS# indicates that an idle memory cycle exists for possible memory refresh. This address strobe signal ADS# also increments idle-cycle counter 602 by one count.

If fewer than eight idle cycles have occurred within the proper refresh period, refresh manager 600 will delay further memory access until all pending memory refreshes are completed. When refresh counter 601 has counted to the proper refresh period without having the required idle cycles for refresh, the output refresh required signal RFREQ# is asserted low. The refresh required signal RFREQ# is sent back to the accessing devices to delay memory access. The low state of the refresh required signal RFREQ# also forces the output signal address strobe ADS# of access suspender 640 high, indicating an idle memory cycle is available for memory refresh. This low address strobe signal ADS# also increments idle-cycle counter 602. The refresh required signal RFREQ# remains low until refresh counter 601 is reset, thus the address strobe signal ADS# will remain high until idle-cycle counter 602 has reached the full count of the required idle memory cycles. When idle-cycle counter 602 reaches a full count, its output signal goes high for one clock cycle to reset refresh counter 601. The count of refresh counter 601 automatically wraps to zero and resumes counting, asserting the refresh required signal RFREQ# high and resuming normal memory access.

Idle-cycle counter 602 counts to the maximum number of refresh cycles required among all memory blocks 100–115. In the present embodiment, memory blocks 100–115 are identical, and require 8 idle cycles within a proper refresh period. In another embodiment, one memory block may require 10 refreshes and another memory block may require 5 refreshes within a proper refresh period. In such an embodiment, the idle cycle counter would need to count to 10 to ensure both memory blocks were refreshed properly within the proper refresh period.

The simple refresh manager described in FIG. 6 manages the refresh of all memory devices in the system in a unified manner. It does not distinguish between individual memory devices in the system by treating them all together as one single memory device.

FIG. 7 is a schematic diagram of refresh manager 700 in accordance with another embodiment of the invention. Refresh manager 700 takes advantage of the fact that when one of memory devices 100–107 is being accessed, the other group of memory devices 108–115 can carry out a memory refresh. Memory blocks 100–115 are separated into two groups of equal size. Each group of memory blocks is managed by a separate refresh counter and idle-cycle counter. Refresh counters 701 and 711 are identical to refresh counter 601. Idle-cycle counters 704 and 714 are identical to idle-cycle counter 602

Refresh manager 700 of FIG. 7 includes refresh counters 701 and 711, AND gates 702 and 712, OR gates 703 and 713, idle-cycle counters 704 and 714, NAND gate 730 and access suspender 740. Access suspender 740 includes NAND gate 720.

AND gate 702 is coupled to receive chip select signals CS#[0:7]. If any one of memory blocks 100–107 is carrying out an external access, one of the chip select signals CS#[0:7] will be low, driving the output signal of AND gate 702 low. OR gate 703 is coupled to receive the address strobe signal ADS# and the output signal of AND gate 702. The address strobe signal ADS# is asserted low when an external access is pending, and deasserted high when an idle cycle exists. A low signal provided by AND gate 702 will force the output signal of OR gate 703 to follow the address strobe signal ADS#, therefore incrementing idle-cycle counter 704 if there is no external access pending. When the required number of idle cycles has been counted, idle-cycle counter 704 will assert its output signal high for one clock cycle to reset counter 701.

If one of the chip select signals CS#[0:7] is asserted low, indicating a memory access to one of memory blocks 100–107, then the other group of memory blocks 108–115 will be idle for that cycle. Chip select signals CS#[8:15] will be high, indicating a lack of memory access to memory blocks 108–115, and forcing the output signal of AND gate 712 high. This high output signal of AND gate 712 forces the output signal of OR gate 713 high without regard to the address strobe signal ADS#, incrementing idle-cycle counter 714.

Refresh counters 701 and 711 count up to the proper refresh period. If either reaches the maximum count, the output signal of that refresh counter goes low, indicating a need to force idle cycles to refresh one of the memory blocks. NAND gate 730 is coupled to receive the output signal of each counter 701 and 711, and provides the refresh required signal RFREQ#. Additionally, access suspender 740 is coupled to receive the output signal of each refresh counter 701 and 711, and the memory request signal MAREQ. If either refresh counter 701 or 711 asserts a low output signal, the output signals of both NAND gates 720 and 730 are forced high. This forces the address strobe signal ADS# and the refresh required signal RFREQ# high. The high address strobe signal ADS# forces an idle cycle into memory system 10, and indicates an idle cycle is currently available for memory refresh. The high refresh required signal RFREQ# indicates to the accessing devices that memory access requests should be delayed. Refresh counters 701 and 711 are reset to zero counts in response to full counts from idle-cycle counters 704 and 714, respectively.

When neither refresh counter 701 nor 711 is full, these refresh counters provide logic high output signals. In response, NAND gate 730 provides a logic low refresh required signal RFREQ#. As described above, a logic low refresh required signal RFREQ# allows external access to be performed without delay. The address strobe signal ADS# provided by access suspender 740 is asserted low when a memory access is pending, and is deasserted high during an idle cycle.

Although the present embodiment shows two groups of eight memory blocks, it is understood that any number of memory blocks may be grouped in any quantity. For example, in another embodiment, three blocks may be present in one group and thirteen blocks present in another group. Appropriate modification must be made to access suspender 740. The present embodiment also may be extended to manage memory devices capable of multi-bank operations. In particular, one bank of the device engages in external access while the other performs refresh. In such a system, the different banks of the memory device are managed by separate sets of refresh managers.

FIG. 8 is a schematic diagram of refresh manager 800 of memory controller 120 in accordance with another embodiment of the present invention. In this embodiment, refresh manager 800 includes refresh counter 801, refresh cycle counter 802 and access suspender 840. Access suspender 840 includes NAND gate 803. Refresh manager 800 functions by forcing a fixed number of idle memory cycles into memory system 10 through access suspender 840 every time refresh counter 801 reaches a full count, despite the number of idle cycles that have occurred.

Refresh counter 801 counts to a proper refresh period. When a full count is reached, the output signal refresh required RFREQ# is asserted low. The low asserted refresh required signal RFREQ# suspends external memory access and asserts the output address strobe signal ADS# from access suspender 840 high, thereby inserting idle memory cycles. Refresh cycle counter 802 counts once for each clock cycle the refresh required signal RFREQ# remains low until refresh cycle counter 802 reaches a full count. In the described embodiment, refresh cycle counter 802 counts to eight, thereby inserting eight idle cycles for refresh. The output signal of refresh cycle counter 802 is then driven high, resetting refresh counter 801. Refresh counter 801 begins counting from zero, deasserting the output signal refresh required RFREQ# high and again allowing access suspender 840 to be directly responsive to the memory access required signal MAREQ.

In the present embodiment, access suspenders 603, 720 and 803 have been shown to generate the address strobe signal ADS# to suspend external memory access, thereby inserting idle cycles for memory refresh. In another embodiment, access suspenders 603, 720 and 803 can be configured to generate the chip select signals CS#[15:0] to suspend external memory access.

Although the invention has been described in connection with several embodiments, it is understood that this invention is not limited to the embodiments disclosed, but is capable of various modifications which would be apparent to a person skilled in the art. For example, memory array 201 can have different sizes in different embodiments. Thus, the invention is limited only by the following claims.

I claim:

1. A memory system comprising:
   a system bus;
   a memory block coupled to the system bus, the memory block having an array of memory cells that require refresh, and a refresh control circuit that refreshes the memory cells during idle cycles of the memory array; and a memory controller coupled to the system bus, the memory controller having a refresh manager that is configured to monitor a number of idle cycles on the system bus during a first time period, and force one or more idle cycles on the system bus if the monitored number of idle cycles is less than a predetermined number of idle cycles during the first time period.

2. The memory system of claim 1, wherein the monitored number of idle cycles plus the forced number of idle cycles is equal to the predetermined number of idle cycles.

3. The memory system of claim 1, wherein the refresh control circuit generates refresh requests.

4. The memory system of claim 3, wherein the memory controller initiates external accesses to the memory block, and wherein the refresh control circuit comprises an access arbiter that always gives the external accesses priority over the refresh requests.

5. The memory system of claim 1, wherein the refresh controller comprises:
   a refresh timer that asserts a control signal at the end of a second time period, wherein the second time period is equal to the first time period divided by the predetermined number of idle cycles; and
   a counter that counts in a first direction each time the refresh timer asserts the control signal, and counts in a second direction each time the memory cells are refreshed.

6. The memory system of claim 5, wherein the counter is configured to accumulate a number of assertions of a control signal up to the predetermined number.

7. The memory system of claim 1, wherein the refresh manager comprises:
   an idle cycle counter for counting the number of idle cycles on the system bus, wherein the idle cycle counter generates a full signal when the number of idle cycles on the system bus is equal to the predetermined number; and
   a refresh counter for counting the first time period, wherein the refresh counter asserts a first control signal to force idle cycles on the system bus if the refresh counter counts the first time period without receiving the full signal from the idle cycle counter.

8. The memory system of claim 7, wherein the refresh manager further comprises an access suspender coupled to receive an external access request signal and the first control signal, wherein the access suspender disables the external access request signal when the first control signal is asserted.

9. The memory system of claim 1, further comprising a second memory block coupled to the system bus, the second memory block having a second array of memory cells that require refresh, and a second refresh control circuit that refreshes the memory cells of the second array during idle cycles of the second array.

10. A memory system comprising:
   a system bus;
   a first set of one or more memory blocks coupled to the system bus, each of the memory blocks in the first set having an array of memory cells that require refresh, and a refresh control circuit that refreshes the memory cells during idle cycles of the memory array;
   a second set of one or more memory blocks coupled to the system bus, each of the memory blocks in the second set having an array of memory cells that require refresh, and a refresh control circuit that refreshes the memory cells during idle cycles of the memory array; and
   a memory controller coupled to the system bus, the memory controller having a refresh manager that is configured to monitor a number of idle cycles on the system bus during a first time period, and force one or more idle cycles on the system bus if the monitored number of idle cycles is less than a predetermined number of idle cycles during the first time period.

11. The memory system of claim 10, wherein the refresh manager is configured to monitor a first number of idle cycles of the first set of memory blocks during the first time period, and a second number of idle cycles of the second set of memory blocks during the first time period, wherein the refresh manager forces one or more idle cycles on the system bus only if either the monitored first number of idle cycles or the monitored second number of idle cycles is less than the predetermined number of idle cycles.

12. A memory system comprising:
   a system bus;
   a memory block coupled to the system bus, the memory block having an array of memory cells that require refresh, and a refresh control circuit that refreshes the memory cells during idle cycles of the memory array; and
   a memory controller coupled to the system bus, the memory controller having a refresh manager that is configured to force a predetermined number of idle cycles on the system bus after a predetermined time period.

13. The memory system of claim 12, wherein the refresh control circuit generates refresh requests.

14. The memory system of claim 13, wherein the memory controller initiates external accesses to the memory block, and wherein the refresh control circuit comprises an access arbiter that always gives the external accesses priority over the refresh requests.

15. The memory system of claim 12, wherein the refresh manager further comprises an access suspender configured to disable an external access request signal when the predetermined number of idle cycles are being forced on the system bus.

16. The memory system of claim 12, further comprising a second memory block coupled to the system bus, the second memory block having a second array of memory cells that require refresh, and a second refresh control circuit that refreshes the memory cells of the second array during idle cycles of the second array.

17. A memory system comprising:
   a memory array having a first number of rows that must be refreshed during a first period;
   a refresh controller that causes one of the rows to be refreshed during an idle cycle of the memory array if a refresh is pending; and
   a refresh manager that forces the memory system to have at least the first number of idle cycles during the first period.

18. A method of operating a memory system having a system bus coupled to a memory block having an array of memory cells that require refresh, the method comprising the steps of:
   refreshing the memory cells during idle cycles of the memory array; and
   monitoring a number of idle cycles on the system bus during a first time period; and
   forcing one or more idle cycles on the system bus if the monitored number of idle cycles is less than a predetermined number of idle cycles during the first time period.

19. The method of claim 18, further comprising the step of controlling the number of forced idle cycles such that the monitored number of idle cycles plus the forced number of idle cycles is equal to the predetermined number of idle cycles.

20. The method of claim 18, further comprising the step of generating refresh requests in the memory block.

21. The method of claim 20, further comprising the steps of:
   providing external access requests to the memory block on the system bus; and
   always giving priority to the external access requests over the refresh requests in the memory block.

22. The method of claim 20, further comprising the step of accumulating the refresh requests up to the predetermined number.

23. The method of claim 18, further comprising the steps of:
   counting the number of idle cycles on the system bus;
   generating a full signal when the number of idle cycles on the system bus is equal to the predetermined number; and
   forcing idle cycles on the system bus if the first time period expires and the full signal has not been generated.

24. The method of claim 23, further comprising the step of disabling an external access signal when idle cycles are forced on the system bus.

25. A method of operating a memory system having a system bus, a first set of one or more memory blocks requiring refresh coupled to the system bus, and a second set of one or more memory blocks requiring refresh coupled to the system bus, the method comprising the steps of:
   refreshing each of the memory blocks during idle cycles of the memory blocks;
   monitoring a number of idle cycles on the system bus during a first time period;
   forcing one or more idle cycles on the system bus if the monitored number of idle cycles is less than a predetermined number of idle cycles during the first time period.

26. The method of claim 25, further comprising the steps of:
   monitoring a first number of idle cycles in the first set of memory blocks during the first time period;
   monitoring a second number of idle cycles in the second set of memory blocks during the first time period; and
   forcing one or more idle cycles on the system bus only if either the monitored first number of idle cycles or the monitored second number of idle cycles is less than the predetermined number of idle cycles.

27. A method of operating a memory system having a system bus coupled to a memory block having an array of memory cells that require refresh, the method comprising the steps of:
   refreshing the memory cells during idle cycles of the memory array; and
   forcing a predetermined number of idle cycles on the system bus after a predetermined time period.

28. The method of claim 27, further comprising the step of generating refresh requests in the memory block.

29. The method of claim 28, further comprising the steps of:
   providing external access requests to the memory block on the system bus; and
   always giving priority to the external access requests over the refresh requests in the memory block.

30. The method of claim 28, further comprising the step of accumulating the refresh requests up to the predetermined number.

31. The method of claim 27, further comprising the step of disabling an external access request signal when the predetermined number of idle cycles are being forced on the system bus.

* * * * *